United States Patent

[11] 3,629,667

[72] Inventors Neil D. Lubart
Syracuse;
Madhukar B. Vora, Beacon, both of N.Y.
[21] Appl. No. 807,351
[22] Filed Mar. 14, 1969
[45] Patented Dec. 21, 1971
[73] Assignee International Business Machines
Corporation
Armonk, N.Y.

[54] SEMICONDUCTOR RESISTOR WITH UNIFORMS CURRENT DISTRIBUTION AT ITS CONTACT SURFACE
2 Claims, 6 Drawing Figs.

[52] U.S. Cl. .......... 317/234 R, 317/235 B, 317/235 D, 317/235 G, 317/235 E, 317/234 N
[51] Int. Cl. .......... H01l 5/02
[50] Field of Search .......... 317/235 (21.1), 235 (22), 235 (22.2), 235 (22.1), 235 (48.1), 235 AE

[56] References Cited

UNITED STATES PATENTS

| | | | |
|---|---|---|---|
| 3,335,340 | 8/1967 | Barson et al. | 317/235 |
| 3,387,193 | 6/1968 | Donald | 317/235 |
| 3,404,321 | 10/1968 | Kurosawa et al. | 317/235 |
| 3,333,326 | 8/1967 | Thomas et al. | 29/574 |
| 3,510,735 | 5/1970 | Potter | 317/235 |

FOREIGN PATENTS

| | | | |
|---|---|---|---|
| 923,153 | 4/1963 | Great Britain | 317/235 (26) |

*Primary Examiner*—John W. Huckert
*Assistant Examiner*—Martin H. Edlow
*Attorneys*—Hanifin and Jancin and Julius B. Kraft

ABSTRACT: A diffused resistor for semiconductor integrated circuits which avoids the problems caused by the high surface current density. The resistor includes at least one semiconductor region of conductivity type opposite to the resistor proper located between a pair of ohmic contacts to the resistor region. This semiconductor region diverts the current flow from the surface of the resistor region and causes a more uniform current distribution across the surface of the ohmic contacts.

INVENTORS
NEIL D. LUBART
MADHUKAR B. VORA

BY J. B. Kraft
ATTORNEY

SEMICONDUCTOR RESISTOR WITH UNIFORMS CURRENT DISTRIBUTION AT ITS CONTACT SURFACE

BACKGROUND OF THE INVENTION

1. Field of the Invention

This invention relates to semiconductor resistors for integrated circuits and more particularly, to improved, diffused semiconductor resistors having reduced surface current density.

2. Description of the Prior Art

In integrated circuits, a plurality of circuit components such as diodes, transistors, capacitors, and resistors are formed within a body of semiconductor material. The resistors are generally formed by a diffusion process and consist of a thin, elongated semiconductor region of selected conductivity at the ends of which there are metal layers forming ohmic contacts. The resistor region is electrically separated from the contiguous region of the semiconductor body by a reverse-biased PN-junction and it is electrically insulated at the surface by a conventional, electrically insulative layer of a material such as $SiO_2$ which completely covers the resistor surface between the contacts.

The diffusion process produces in the semiconductor resistor an impurity distribution which is highest at that surface where impurities are introduced into the semiconductor body and gradually diminishes toward the interior. As a result of this gradient of impurity, the conductivity of the resistor region will be highest at that surface. Therefore, when a current flows in the resistor, the current density will be highest at such surface of the resistor. One consequence of this nonuniform distribution of current in the resistor is a localized heating of the surface of the resistor region. Another consequence is that in the areas where there are the ohmic contacts, there is a nonuniform distribution of current across the contact surfaces. More particularly, the current is highest in that portion of each contact which is closest to the other contact.

It has been found that discontinuities and fractures tend to arise in the metallic layers forming the ohmic contacts. This is believed to be caused by electromigration (i.e., movement) of the atoms of the metallic layers. Such a movement appears to result from the localized heating of the surface of the semiconductor body as well as from the heating of a portion of the metallic layer because of the high current density in that portion.

SUMMARY OF THE INVENTION

Accordingly, the primary object of the present invention is to improve the surface current distribution in diffused semiconductor resistors.

Another object of this invention is to substantially reduce damage to the metallic contact lands in a semiconductor resistor due to the flow of current through the resistor.

A further object of this invention is to provide novel and improved semiconductor resistors of predetermined resistance.

In accordance with the invention, there is provided a diffused semiconductor resistor for integrated circuits which avoids the problems produced by the high surface current density. This resistor employs at least one blocking region for directing current flow, which blocking region is located between the electrical contacts to the resistor region and extends from the surface into the resistor region for a limited depth. The blocking region is covered by a continuous electrically insulative layer. The blocking region directs the current flow in a direction more perpendicular to the contact surface, thereby improving the current distribution in the electrical contacts and avoiding damage to these contacts.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
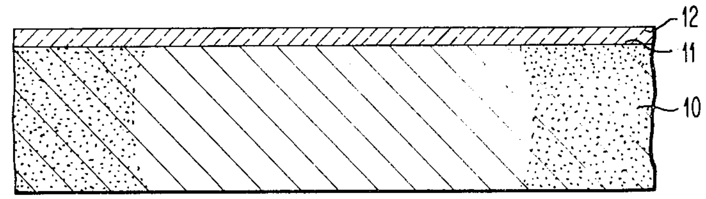
FIG. 1 shows a sectional view of a semiconductor body.

Referring to FIG. 1, the resistor is fabricated from a body 10 of semiconductor material, which may be a portion of an integrated circuit. For the purposes of the following description, it is assumed that body 10 is constituted by P-type silicon; however, it is apparent that the present invention applies also to bodies of other semiconductor materials as well as to bodies of different conductivity type. Surface 11 of body 10 is covered by an oxide protecting layer 12 which is electrically insulative. This layer is obtained by conventional techniques, such as by placing the silicon body in an oxidizing atmosphere at an elevated temperature and adding $H_2O$ vapors to the oxidizing atmosphere. Layer 12 protects surface 11 from ambient impurities.

Figure 2:
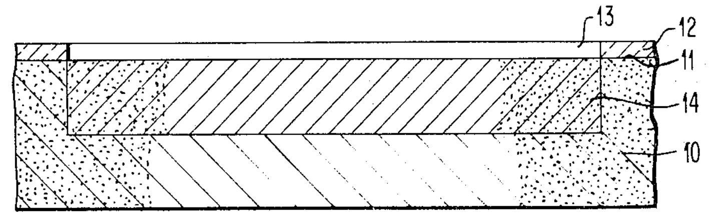
FIG. 2 shows a sectional view of the semiconductor body of FIG. 1 in which a resistor region has been diffused.

In FIG. 2, there is shown an opening or aperture 13 which corresponds to the surface dimensions of the resistor. Opening 13 is obtained in silicon dioxide layer 12 by conventional photoresist and etching techniques. A photoresist material is one which becomes resistant to the etching action of certain chemicals in the areas which have been exposed to light. The photoresist is applied on the upper surface of layer 12, and it is exposed to light through a mask which is opaque in correspondence to the part to be etched. The photoresist is subsequently developed and the nonexposed portion is washed away. Then, an etchant, such as an ammonium bifluoride buffered solution of hydrofluoric acid, is used to attack the silicon dioxide layer. During the etching step, the photoresist layer serves to mask the surface of silicon dioxide layer 12 so as to insure the removal of only the part 13 corresponding to the unexposed portion.

A conductivity directing impurity of type different from that of body 10 is now diffused through opening 13 into the portion of body 10 which is exposed. The impurity used is a donor such as phosphorus, arsenic, antimony or the like. The diffusion process is carried out until the region 14 of body 10 is converted to N-type conductivity. The body is then treated in an etchant, such as a solution of hydrofluoric acid, so as to remove the remaining portions of silicon dioxide layer 12.

Figure 3:
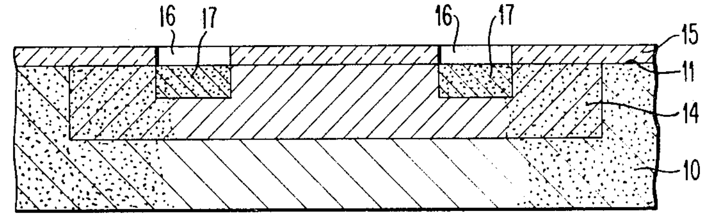
FIG. 3 shows a sectional view of the semiconductor body of FIG. 2 in which two additional regions have been diffused in accordance with the principles of the present invention.

A new, continuous silicon dioxide layer 15 is subsequently formed on surface 11 of body 10, and two openings 16 are produced on region 14 in the position shown in FIG. 3. An acceptor, such as aluminum, boron, indium or gallium, is diffused in the portion of region 14 which is exposed through openings 16. This diffusion step is accomplished under conditions of source concentration and heating temperature to form two spaced P-type regions 17, of limited depth, completely enclosed and extending within N-type region 14. These P-type regions 17 are the blocking regions which direct the current flow within the resistor region 14. The silicon dioxide layer 15 is then removed.

Figure 4:
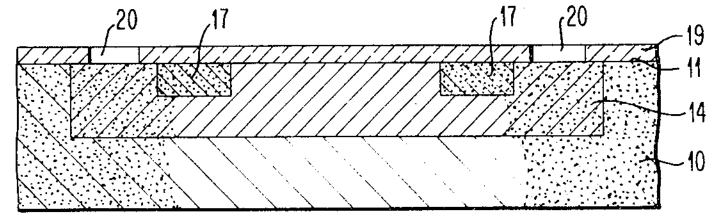
FIG. 4 shows a sectional view of a semiconductor resistor according to the present invention with the contact openings formed.

As shown in FIG. 4, a new, electrically insulative masking layer 19 of dielectric material, such as silicon dioxide, is then deposited on the surface of region 14, and two spaced openings 20 are formed by conventional techniques. Openings 20 expose two surface parts of region 14 external to regions 17. This leaves regions 17 completely covered by electrically insulative layer 19.

Figure 5:
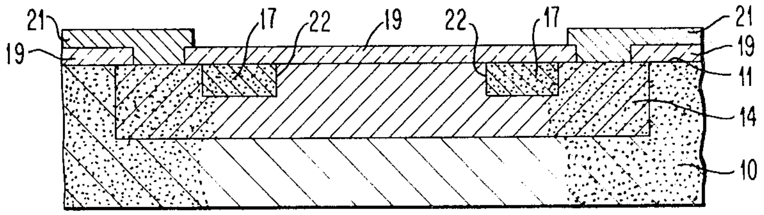
FIG. 5 shows a sectional view of a semiconductor resistor according to the present invention with the interconnecting metal lands.

Referring now to FIG. 5, a layer of a metal such as aluminum, chromium or the like, is deposed on the surface of semiconductor body, for example, by evaporation. The metallic layer is then selectively etched to leave lands 21 which form ohmic contacts on the exposed portion of resistor region 14 and interconnect the resistor to the other circuit components. FIG. 5 shows the complete semiconductor resistor according to the present invention.

When a difference of potential is applied through the ohmic contacts to the resistor region 14, a current flows through the resistor. Because the resistivity of region 14 is lowest near surface 11, the current density tends to be greatest near that surface and in the part of each ohmic contact which is closest to the other contact. However, regions 17 offer a substantial resistance to the flow of current, and divert the current path to a direction which is more perpendicular to the ohmic contact surfaces. In this manner, the current density across the contact surface is rendered more uniform.

Figure 6:
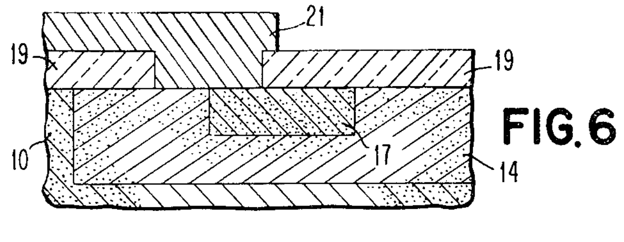
FIG. 6 is a fragmentary, sectional view of a structure in accordance with another embodiment of the present invention.

In the resistor shown in the drawing, blocking regions 17 are shown near the metal lands 21. Although the regions 17 are shown as being spaced from the metal contacts, it is not necessary that they be so spaced. The regions 17 will perform their blocking function whether or not they are in actual contact with the metal lands 21. Further, it is not necessary that the regions 17 be electrically insulated from the lands 21. However, it is essential that regions 17 are electrically insulated from all other lands or contacts. Insulative coating 19, which is continuous between lands 21, performs this function. This prevents any stray potential from being developed in regions 17 which may cause the boundary 22, between regions 17 and 14, to act as a diode junction. As a further assurance against such a diode junction, contact 21 may be positioned, as shown in FIG. 6, so as to overlap boundary 22 and also contact regions 17. In such a structure, regions 17 and 14 will, of course, be at the same potential.

It is also noted that, while in the foregoing description of a preferred embodiment of the present invention the blocking regions have been formed by a diffusion process, the blocking impurity can be introduced in the resistor region by any other conventional process. For example, the part of the semiconductor body corresponding to the blocking region can be etched and a new semiconductor material of proper conductivity can be refilled by an epitaxial deposition process. The blocking regions can also be formed by alloying a metal imparting the proper type of conductivity. Alternatively, the part of the semiconductor body corresponding to the blocking regions can be simply etched and, if desired, refilled with a dielectric material.

Blocking regions of the type before described also constitute simple means for controlling the resistance of semiconductor diffused resistors. In fact, the blocking regions can be selectively formed in the resistor region to direct a predetermined part of the current path in semiconductor regions of low conductivity, thus controlling the total resistance of the resistor. This feature is particularly useful when the resistor region has a higher conductivity than would be desirable. This condition is caused sometimes when the resistor region is formed during a diffusion process, which process also simultaneously forms other regions of the integrated circuit.

Although in the embodiment shown the resistor region has an elongated shape, it is apparent that the present invention applies also to semiconductor resistor regions of different shape, as well as to semiconductor resistors having more than two ohmic contacts.

It is also to be noted that, while the present invention has been described in connection with semiconductor resistors, it can also be applied to diffused underpasses, or to all semiconductor devices in which it is desirable to control the current density in diffused regions or in conductive lands which are in contact with embedded semiconductor regions, e.g., diodes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor resistor structure comprising:
a region of one conductivity type;
at least two spaced electrical contacts on the surface of and in ohmic contact with said region of one conductivity type;
at least one region of opposite conductivity type located adjacent to and in contact with each contact and intermediate said electrical contacts for directing the current flow therebetween, said regions of opposite conductivity type being fully enclosed within said region of one conductivity type, spaced from each other, and extending from said surface; and,
an electrically insulative coating completely covering the surface located intermediate said contacts.

2. A semiconductor resistor structure according to claim 1 wherein said electrical contacts are metallic.

* * * * *